United States Patent [19]

Akagiri

[11] Patent Number: 5,583,967
[45] Date of Patent: Dec. 10, 1996

[54] APPARATUS FOR COMPRESSING A DIGITAL INPUT SIGNAL WITH SIGNAL SPECTRUM-DEPENDENT AND NOISE SPECTRUM-DEPENDENT QUANTIZING BIT ALLOCATION

[75] Inventor: Kenzo Akagiri, Kanagawa, Japan

[73] Assignee: Sony Corporation, Japan

[21] Appl. No.: 78,547

[22] Filed: Jun. 16, 1993

[30] Foreign Application Priority Data

Jun. 16, 1992 [JP] Japan .................................. 4-156982

[51] Int. Cl.$^6$ ............................... G10L 3/02; G10L 9/00
[52] U.S. Cl. ..................... 395/2.38; 395/2.33; 395/2.35; 395/2.39
[58] Field of Search ............................. 395/2.38, 2.31, 395/2.39, 2, 2.33, 2.16, 2.18; 381/31, 29–36

[56] References Cited

U.S. PATENT DOCUMENTS

| | | |
|---|---|---|
| 3,349,183 | 10/1967 | Campanella . |
| 4,184,049 | 1/1980 | Crochiere et al. .................. 381/31 |
| 4,455,649 | 6/1984 | Esteban et al. ................. 381/31 X |
| 4,516,241 | 5/1985 | Farah et al. ..................... 370/110.1 |
| 4,535,472 | 8/1985 | Tomcik ................................. 381/31 |
| 4,569,058 | 2/1986 | Grallert .............................. 375/27 |
| 4,573,187 | 2/1986 | Bui et al. ............................. 381/43 |
| 4,622,598 | 11/1986 | Doi et al. ............................ 360/22 |
| 4,625,286 | 11/1986 | Papamichalis et al. ......... 364/513.5 |
| 4,697,212 | 9/1987 | Osawa et al. ........................ 360/48 |

(List continued on next page.)

FOREIGN PATENT DOCUMENTS

| | | | |
|---|---|---|---|
| 0145788A1 | 6/1985 | European Pat. Off. | ........ H04B 12/02 |
| 0255111A2 | 2/1988 | European Pat. Off. | ........ G11B 20/10 |
| 0349325A2 | 1/1990 | European Pat. Off. | ........ G11B 20/10 |
| 0370277A3 | 5/1990 | European Pat. Off. | ........ H04B 1/66 |
| 0424016A2 | 10/1990 | European Pat. Off. | ........ H04B 1/66 |
| 0409248A2 | 1/1991 | European Pat. Off. | ........ H03M 7/30 |
| 0420745A2 | 4/1991 | European Pat. Off. | ........ H04B 1/66 |

(List continued on next page.)

OTHER PUBLICATIONS

An Application Specific DSP Chip for 100 MHZ Data Rates, Magar et al., IEEE 1988–pp. 1989–1992.
Perceptual Transform Coding of Wideband Stereo Signals, James D. Johnston, ICASSP '89, vol. 3, pp. 1993–1996.
Signal Compression: Technology Targets and Research Directions, Nikil Jayant, IEEE vol. 10, No. 5, pp. 796–818.

(List continued on next page.)

Primary Examiner—Allen R. MacDonald
Assistant Examiner—Richemond Dorvil
Attorney, Agent, or Firm—Limbach & Limbach L.L.P.

[57] ABSTRACT

An apparatus for compressing a digital audio input signal to provide a compressed output signal. A circuit derives plural spectral coefficients from the input signal and groups the spectral coefficients into bands. A distributing circuit distributes a total available number of quantizing bits between signal spectrum-dependent quantizing bits and noise spectrum-dependent quantizing bits. A circuit determines a magnitude for each band, and, in response thereto, allocates the signal spectrum-dependent quantizing bits among the bands. This allocates to each band a number of signal spectrum-dependent quantizing bits for quantizing each spectral coefficient in the band. A circuit determines a subjectively-allowable noise spectrum and, in response thereto, allocates the noise spectrum-dependent quantizing bits among the bands. This allocates to each band a number of noise spectrum-dependent quantizing bits for quantizing each spectral coefficient in the band. A quantizing circuit quantizes the spectral coefficients in each band using a total number of quantizing bits determined by summing the number of signal spectrum-dependent quantizing bits allocated to the band and the number of noise spectrum-dependent quantizing bits allocated to the band. The distribution circuit sets the distribution ratio in response to a circuit that calculates the smoothness of the spectrum of the input signal. In this manner, optimum quantizing for both musical signals and single sine wave signals are given by a single processing operation, without the need to repeatedly adjust the quantizing bit allocation.

32 Claims, 9 Drawing Sheets

U.S. PATENT DOCUMENTS

| | | | |
|---|---|---|---|
| 4,706,265 | 11/1987 | Furukawa | 375/122 |
| 4,748,579 | 5/1988 | Zibman et al. | 364/736 |
| 4,873,589 | 10/1989 | Inazawa et al. | 360/53 |
| 4,882,754 | 11/1989 | Weaver et al. | 381/35 |
| 4,885,790 | 12/1989 | McAulay | 381/36 |
| 4,896,362 | 1/1990 | Veldhuis et al. | 381/41 |
| 4,903,301 | 2/1990 | Kondo et al. | 381/30 |
| 4,912,763 | 3/1990 | Galand et al. | 381/31 |
| 4,932,062 | 6/1990 | Hamilton | 381/43 |
| 4,949,383 | 8/1990 | Koh et al. | 381/31 |
| 4,972,484 | 11/1990 | Thiele et al. | 381/37 |
| 5,016,107 | 5/1991 | Sasson et al. | 358/209 |
| 5,040,217 | 8/1991 | Brandenburg et al. | 381/47 |
| 5,049,992 | 9/1991 | Citta et al. | 358/140 |
| 5,105,463 | 4/1992 | Veldhuis et al. | 381/30 |
| 5,109,417 | 4/1992 | Fielder et al. | 381/29 |
| 5,115,240 | 5/1992 | Fujiwara et al. | 341/51 |
| 5,117,228 | 5/1992 | Fuchigami et al. | 341/51 |
| 5,134,475 | 7/1992 | Johnston et al. | 375/133 |
| 5,142,656 | 8/1992 | Fielder et al. | 381/37 |
| 5,150,387 | 9/1992 | Yoshikawa | 375/122 |
| 5,151,941 | 9/1992 | Nishiguchi et al. | 381/46 |
| 5,157,760 | 10/1992 | Akagiri | 395/2 |
| 5,159,611 | 10/1992 | Tomita et al. | 375/34 |
| 5,166,686 | 11/1992 | Sugiyama | 341/155 |
| 5,185,800 | 2/1993 | Mahieux | 381/29 |
| 5,204,677 | 4/1993 | Akagiri et al. | 341/118 |
| 5,218,561 | 6/1993 | Iwadare | 364/725 |
| 5,222,189 | 6/1993 | Fielder | 395/2 |
| 5,241,603 | 8/1993 | Akagiri et al. | 381/37 |
| 5,243,588 | 9/1993 | Maeda et al. | 369/54 |
| 5,264,846 | 11/1993 | Oikawa | 341/76 |
| 5,268,685 | 12/1993 | Fujiwara | 341/76 |
| 5,285,476 | 2/1994 | Akagiri et al. | 375/25 |
| 5,294,925 | 3/1994 | Akagiri | 341/50 |
| 5,301,205 | 4/1994 | Tsutsui et al. | 375/1 |
| 5,311,561 | 5/1994 | Akagiri | 375/122 |
| 5,375,189 | 12/1994 | Tsutsui | 395/2.38 |
| 5,381,143 | 1/1995 | Shimoyoshi et al. | 341/51 |
| 5,388,093 | 2/1995 | Yoshida et al. | 369/124 |
| 5,388,209 | 2/1995 | Akagiri | 395/2.38 |
| 5,406,428 | 4/1995 | Suzuki | 360/53 |
| 5,461,378 | 10/1995 | Shimoyoshi et al. | 341/51 |
| 5,471,558 | 11/1995 | Tsutsui | 395/2.28 |

FOREIGN PATENT DOCUMENTS

| | | | |
|---|---|---|---|
| 0446031A3 | 9/1991 | European Pat. Off. | H04B 1/66 |
| 0458645A2 | 11/1991 | European Pat. Off. | H04B 1/66 |
| 0466190A2 | 1/1992 | European Pat. Off. | G11B 20/10 |
| 0463473A2 | 1/1992 | European Pat. Off. | G06F 15/332 |
| 0473367A1 | 3/1992 | European Pat. Off. | H03M 7/30 |
| 0506394A2 | 9/1992 | European Pat. Off. | G10L 7/00 |
| 0525809A2 | 2/1993 | European Pat. Off. | H04B 1/66 |
| 0423050A1 | 4/1991 | France | H04B 1/66 |
| A01069181 | 3/1989 | Japan | H04N 7/137 |
| WO90/09064 | 8/1990 | WIPO | H04B 1/66 |
| WO91/16769 | 10/1991 | WIPO | H04B 1/66 |
| WO92/17884 | 10/1992 | WIPO | G11B 20/10 |

OTHER PUBLICATIONS

Subband/Transform Coding Using Filter Bank Designs Based on Time Domain Aliasing Cancellation, Princen et al., 1987 ICCC, pp. 2161–2164.

Brandenburg et al., "Aspec: Adaptive Spectral Entropy Coding of High Quality Music Signals", Audio Engineering Society Preprint No. 3011 (1991 Feb.).

Davidson et al., "Low Complexity Transform Coder for Satellite Link Applications" Audio Engineering Society Preprint No. 2966 (1990 Sep.).

Esteban et al., "Application of Quadrature Mirror Filters To Split Band Voice Coding Schemes", Record of the 1977 ICASSP, pp. 191–195 (1977 May).

Johnston, "Transform Coding of Audio Signals Using Perceptual Noise Criteria", 6 IEEE Trans. on Selected Areas in Communications, 314–323 (1988 Feb.).

Rothweiler, "Polyphase Quadrature Filters—A New Subband Coding Technique", 3 Proc. 1983 ICASSP 1280–1283 (1983 Apr.).

Schroeder et al., "High Quality Digital Audio Encoding with 3.0 Bits/Sample Using Adaptive Transform Coding", Audio Engineering Society Reprint No. 2321 (1986 Mar.).

Stoll et al., "Masking–Pattern Adapted Sub–Band Coding: Use of the Dynamic Bit–Rate Margin", Audio Engineering Society Preprint No. 2585 (1988 Mar.).

Thiele et al., "Low Bit–Rate Coding of High–Quality Audio Signals—An Introduction to MASCAM System", 230 EBU Technical Review 71–93 (1988 Aug.).

Y. Mahieux & J. P. Petit, "Transform Coding of Audio Signals at 64 kbit/s", Globecom 90, vol. 1, pp. 518–522 (Dec. 1990).

An application–specific FFT processor Electronic Engineering, Jun. 1988 pp. 100 and 104–106.

R. E. Crochiere, S. A. Webber and J. L. Flanagan, "Digital Coding of Speech in Sub–bands", in *The Bell System Technical Journal*, pp. 1069–1085, vol. 55, No. 8, Oct. 1976, USA.

Joseph H. Rothweller, "Polyphase Quadrature Filters—A New Subband Coding Technique", *ICASSP*, pp. 1280–1283, Jun. 1983, Boston, USA.

Rainer Zelinski and Peter Noll, "Adaptive Transform Coding of Speech Signals", *IEEE Transactions on Acoustics, Speech, and Signal Processing*, pp. 299–300, vol. ASP–25, No. 4, Aug. 1977.

Michael A. Krasner, "The Critical Band Coder—Digital Encoding of Speech Signals Based on the Perceptual Requirements of the Auditory System", *IEEE Transactions on Acoustics, Speech, and Signal Processing*, pp. 327–331, vol. 3, Apr. 1980.

A Robust Vector Quantized Sub–Band Coder For Good Quality Speech Coding At 9.6 KB/S Kondoz et al., IEEE/ 13–17 Jun. 1988.

APPARATUS FOR COMPRESSING A DIGITAL INPUT SIGNAL WITH SIGNAL SPECTRUM-DEPENDENT AND NOISE SPECTRUM-DEPENDENT QUANTIZING BIT ALLOCATION

FIELD OF THE INVENTION

This invention relates to an apparatus for compressing a digital audio input signal for transmission or recording at a substantially reduced bit rate. The invention also relates to an expander for expanding the compressed signal produced by the compressor.

BACKGROUND OF THE INVENTION

A variety of techniques for compressing digital audio or voice signals are known. For example, sub-band coding, a non-block-forming frequency band dividing system, in which the input audio signal is not divided in time into blocks, but is divided in frequency by a filter into plural frequency bands for quantizing. In a block-forming frequency and dividing system, such as a transform coding system, the input audio signal in the time domain is converted into spectral coefficients in the frequency domain by an orthogonal transform. The resulting spectral coefficients are divided into plural frequency bands, and the spectral coefficients in each band are quantized.

There is also known a technique consisting of a combination of sub-band coding and transform coding, in which frequency range signals produced by dividing the input audio signal in frequency are individually orthogonally transformed into spectral coefficients. The spectral coefficients are then divided into plural frequency bands, and the spectral coefficients in each band are then quantized.

Among the filters useful for dividing a digital audio input signal into bands is the quadrature mirror (QMF) filter, which is described, for example, in R. E. Crochiere, *Digital Coding of Speech in Sub-bands*, 55 Bell. Syst. Tech. J. No. 8, (1976). The technique of dividing the audio input signal in frequency into frequency bands of an equal width is discussed in Joseph H. Rothweiler, *Polyphase Quadrature Filers—a New Sub-band Coding Technique*, ICASSP 83, BOSTON (1983).

As a technique for quantizing the spectral coefficients obtained by frequency division, a sub-band system which takes the characteristics of the human sense of hearing into account is known. The audio frequency range may be divided in frequency into plural bands, such as 25 critical bands, which have a bandwidth that increases with increasing frequency. The spectral coefficients in each of the respective bands are quantized by adaptive bit allocation applied to each band. For example, the spectral coefficients resulting from a modified discrete cosine transform (MDCT) are divided into bands and the spectral coefficients in each band are quantized using an adaptively-determined number of bits.

Two known adaptive bit allocation techniques will be now be described. First, in the technique described in ASSP-25, IEEE TRANSACTIONS OF ACOUSTICS, SPEECH, AND SIGNAL PROCESSING, No. 4, August 1977, bit allocation is carried out on the basis of the magnitude of the signals of the respective bands. Although this system provides a flat quantizing noise spectrum, and minimizes noise energy, noise perceived by the listener is not minimized because this technique does not exploit the masking characteristics of the human sense of hearing.

On the other hand, the technique described in M. A. Kransner, *The Critical Band Coder-Digital Encoding of the Perceptual Requirements of the Auditory System*, ICASSP 1980, uses the masking characteristics of the human sense of heating to determine the signal-to-noise ratio necessary for each band to make a fixed quantizing bit allocation. However, this technique provides relatively poor results with a single sine-wave input because of its fixed bit allocation.

Thus, the subjective noise level is not optimum if the bit allocation is made depending on the magnitude of the band signals to minimize the quantizing noise level, whereas satisfactory signal-to-noise characteristics are unlikely to be produced with a fixed bit allocation taking account only of masking.

To overcome the above-mentioned drawbacks in the adaptive bit allocation techniques discussed above, the data compression apparatus described in U.S. patent application Ser. No. 07/924,298, the specification of which is incorporated herein by reference, has been proposed. In this apparatus, the total number of bits available for quantizing all the spectral coefficients resulting from orthogonally transforming a digital input signal is divided between bits to be allocated according to the level of the input signal (level-dependent bits) and bits to be allocated according to the spectral distribution of the input signal (spectrum-dependent bits). A total number of bits, consisting of level-dependent bits and spectrum-dependent bits, is allocated to each band. Each spectral coefficient in the band is quantized with the allocated number of bits. The total number of bits allocated for quantizing each spectral coefficient in each band is the sum of the number of level-dependent bits allocated to the band and the number of spectrum-dependent bits allocated to the band.

The division ratio of the total available number of quantizing bits between level-dependent bits and spectrum-dependent bits can be variable, depending on a signal related to the input signal such that, the smoother the spectrum of the input signal (i.e., the less tonal the input signal), the larger is the division ratio in favor of level-dependent bits. For each block of the digital audio input signal, the number of level-dependent bits allocated for quantizing the each of the spectral coefficients in each band is determined according to one of plural predetermined bit allocation patterns selected according to the level of the input signal. The number of spectrum-dependent bits allocated for quantizing the spectral coefficients in each band corresponding to each block of the digital audio input signal depends on the band magnitude of each band. The band magnitude can be any one of the energy of the band, the peak level in the band, the integrated level over the band, or some other suitable parameter relating to the band.

If the energy of the input signal is concentrated in particular spectral regions, as in the case of a single sine wave input, the quantizing bit allocation technique just described enables the number of bits allocated to bands containing high levels of spectral energy to be increased to improve the overall signal-to-noise characteristics. Since the human sense of hearing is, in general, highly sensitive to signals containing narrow spectral components, the above bit allocation technique improves not only the measured value of signal-to-noise ratio, but also the signal-to-noise ratio perceived by the listener.

However, if spectrum-dependent bit allocation is performed simply with the purpose of improving the signal-to-noise characteristics, a sufficient number of bits cannot be allocated to bands corresponding to the spectral regions in a signal containing a large number of narrow spectral components, such as the sound of a triangle. Accordingly, U.S. patent application Ser. No. 08/011,376, the specification of which is also incorporated herein by reference, discloses a version of the compressor just described in which the number of spectrum-dependent bits allocated for quantizing the spectral coefficients in each band depends on the band magnitude of the band, weighted depending on the band frequency.

OBJECTS AND SUMMARY OF THE INVENTION

It is an object of the present invention to provide an apparatus for compressing a digital audio input signal that provides a high degree of compression, and that provides an output signal that, after complementary expansion, decoding, and reproduction, has an optimum sound quality as perceived by the listener, even when the audio input signal consists of a narrow spectral line, such as a 1 kHz sine wave.

Accordingly, the invention provides an apparatus for compressing a digital audio input signal to provide a compressed output signal. The apparatus comprises a circuit for deriving plural spectral coefficients from the input signal and for grouping the spectral coefficients into bands, and a distributing circuit, responsive to the input signal, for distributing a total available number of quantizing bits between signal spectrum-dependent quantizing bits and noise spectrum-dependent quantizing bits.

The apparatus also includes a circuit for determining a magnitude for each band, and, in response to the magnitude for each band, for allocating the signal spectrum-dependent quantizing bits among the bands. This allocates to each band a number of signal spectrum-dependent quantizing bits for quantizing each spectral coefficient in the band. The apparatus further includes a circuit for determining a subjectively-allowable noise spectrum and, in response to the noise spectrum, for allocating the noise spectrum-dependent quantizing bits among the bands. This allocates to each band a number of noise spectrum-dependent quantizing bits for quantizing each spectral coefficient in the band.

Finally, the apparatus includes a quantizing circuit for quantizing the spectral coefficients in each band using a total number of quantizing bits determined by summing the number of signal spectrum-dependent quantizing bits allocated to the band and the number of noise spectrum-dependent quantizing bits allocated to the band.

The invention also provides a complementary expander for expanding a compressed digital signal to provide a digital audio output signal. The compressed digital signal being derived from a digital audio input signal having a spectrum by a compression method in which plural spectral coefficients are derived from the input signal, and are grouped into bands, and a magnitude for each band is determined. In response to the input signal, a total available number of quantizing bits is distributed between noise spectrum-dependent bits for allocation among the bands depending on a subjectively allowable noise spectrum, and signal spectrum-dependent bits for allocation among the bands according to the magnitudes of the bands. The spectral coefficients in each band are quantized using a total number of bits determined by summing the noise spectrum-dependent bits allocated to the band and the signal spectrum-dependent bits allocated to the band. Finally the quantized spectral components are included in the compressed signal.

The expander comprises a circuit for extracting quantized spectral coefficients from the compressed signal; a circuit for dequantizing the quantized spectral components; and a circuit for deriving the output signal from the dequantized spectral components.

The invention further provides a system for recording a digital audio input signal having a bit rate on a medium, and for reproducing the digital input signal from the medium to provide a digital audio output signal. The system derives a compressed signal for recording on the medium from the input signal; and derives the output signal from the compressed signal reproduced from the medium. The compressed signal has a bit rate lower than the bit rate of the input signal. The system comprises a compressor and an expander.

The compressor comprises a circuit for deriving plural spectral coefficients from the input signal and for grouping the spectral coefficients into bands, and a circuit, responsive to the input signal, for distributing a total available number of quantizing bits between signal spectrum-dependent quantizing bits and noise spectrum-dependent quantizing bits. The compressor also includes a circuit for determining a magnitude for each band, and, in response thereto, for allocating the signal spectrum-dependent quantizing bits among the bands. This allocates to each band a number of signal spectrum-dependent quantizing bits for quantizing each spectral coefficient in the band. The compressor further includes a circuit for determining a subjectively-allowable noise spectrum and, in response thereto, for allocating the noise spectrum-dependent quantizing bits among the bands. This allocates to each band a number of noise spectrum-dependent quantizing bits for quantizing each spectral coefficient in the band.

A quantizing circuit quantizes the spectral coefficients in each band using a total number of quantizing bits determined by summing the number of signal spectrum-dependent quantizing bits allocated to the band and the number of noise spectrum-dependent quantizing bits allocated to the band. Finally, an including circuit includes the quantized spectral coefficients in the compressed signal. The expander comprises a circuit for extracting quantized spectral coefficients from the compressed signal; a circuit for dequantizing the quantized spectral components; and a circuit for deriving the output signal from the dequantized spectral components.

The system could equally be used for compressing and expanding a signal for transmission via a transmission medium.

Finally, the invention provides a medium in which a compressed digital signal is recorded. The compressed digital signal is derived from a digital audio input signal having a spectrum by a compression method in which plural spectral coefficients are derived from the input signal, are grouped into bands, and a magnitude is determined for each band. In response to the input signal, a total available number of quantizing bits is distributed between noise spectrum-dependent bits for allocation among the bands depending on a subjectively allowable noise spectrum, and signal spectrum-dependent bits for allocation among the bands according to the magnitudes of the bands. The spectral coefficients in each band are quantized using a total number of bits determined by summing the noise spectrum-dependent bits allocated to the band and the signal spectrum-dependent bits allocated to the band. Finally, the quantized spectral components are included in the compressed signal.

In the above-mentioned compressor, expander, system, and medium according to the invention, the total available number of quantizing bits is distributed signal spectrum-dependent quantizing bits and noise spectrum-dependent quantizing bits with the distribution ratio determined in response to the input signal. The smoother the spectrum of the input signal, the greater the distribution ratio in favour of the noise spectrum-dependent quantizing bits.

A signal indicating difference information between adjacent spectral components are used as an index indicating the smoothness of the spectrum. Alternatively, a signal derived from the block floating coefficients generated for the bands can be used to indicate spectral smoothness. This approach requires fewer processing steps, since the block floating coefficients are already calculated.

According to the present invention, when the input signal has a spectral distribution typical of that of a music signal, the quantizing bits are broadly distributed, and the subjective noise level perceived by the listener is reduced by masking. When the input signal has a highly tonal spectrum, such as that of a 1 kHz sine wave, the bit allocation scheme of the present invention allows quantizing bits to be concentrated in the part of the spectrum in which the signal has its largest magnitude. This provides an improved signal-to-noise ratio with the highly-tonal input signal.

DETAILED DESCRIPTION OF THE INVENTION

Figure 1:
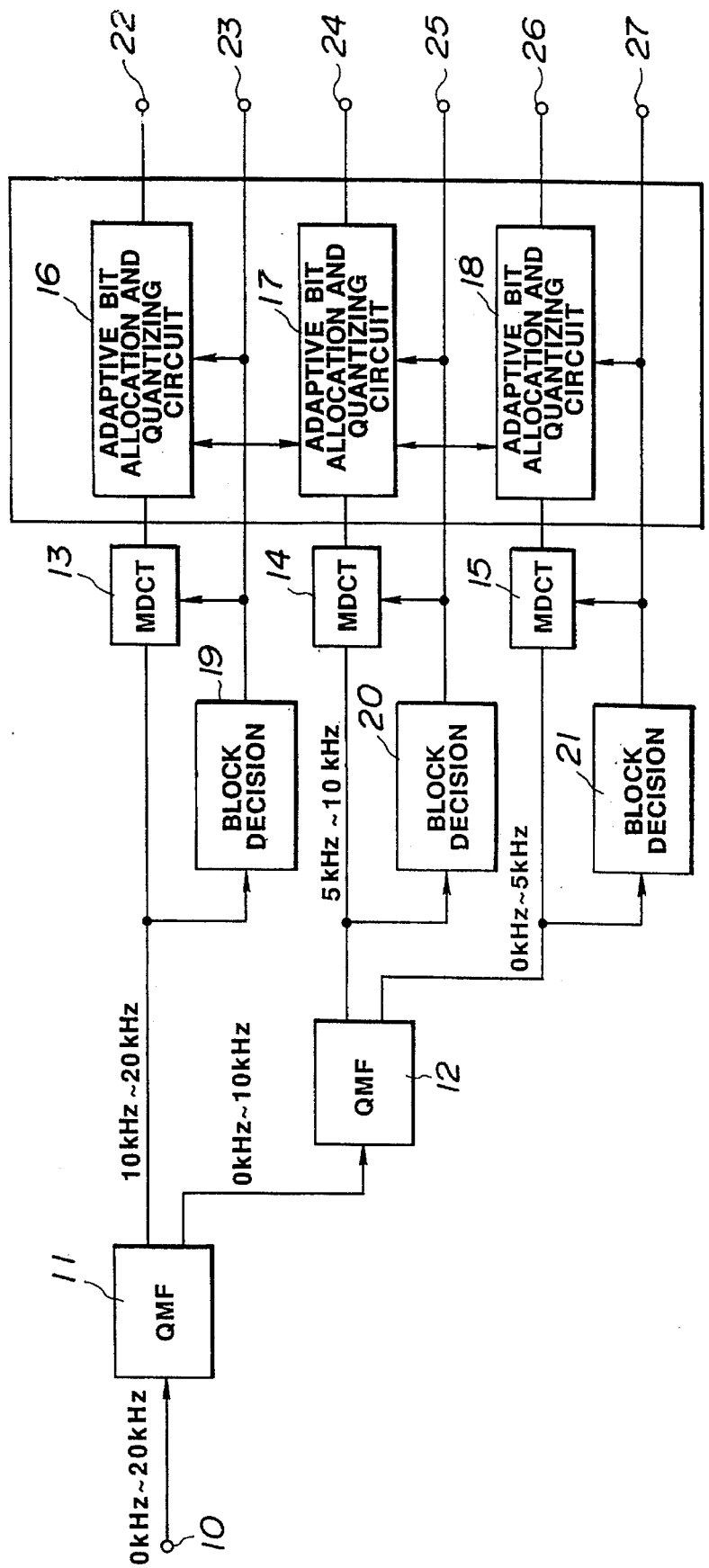
FIG. 1 is a block diagram showing the compressor according to the invention for compressing a digital audio input signal.

FIG. 1 shows the compressor according to the invention of a high efficiency digital compressor/expander system according to the invention. The compressor compresses a digital audio input signal, such as a PCM audio signal, employing the techniques of subband coding (SBC), adaptive transform coding (ATC), and adaptive bit allocation (APC-AB).

The compressor for a digital audio input signal shown in FIG. 1 divides the digital audio input signal using a filter etc. into plural frequency ranges, which may be of equal bandwidth. The compressor then orthogonally transforms the frequency range signal in each frequency range. The spectral coefficients resulting from orthogonally transforming the frequency range signals from the time domain to the frequency domain are grouped into frequency bands, preferably critical bands, that take account of the characteristics of the human sense of hearing. Alternatively, the spectral coefficients may be generated by using suitable filters to divide the input signal in frequency into plural narrow frequency bands without dividing the inputs signal in time. The spectral components in each frequency band are then quantized by adaptive bit allocation.

In the compressor according to the present invention, the block size of each of the frequency range signals that is subject to the orthogonal transform (i.e., the number of samples of each frequency range signal per block) is adaptively changed in response to the dynamic characteristics of the input signal. Additionally, block floating is applied to the spectral coefficients in each critical band. The spectral coefficients in higher frequency critical bands may optionally be grouped into plural sub bands and block floating may then be applied to the spectral coefficients in each sub band. Where reference is made in the following description to critical bands, it is to be understood that the higher frequency critical bands may optionally be divided in frequency into plural sub-bands. When higher frequency critical bands are divided into sub bands, the reference to critical bands also applies to the sub bands into which the higher-frequency critical bands have been divided.

A critical band is a frequency band produced by a frequency division system that takes account of the frequency discrimination characteristics of the human sense of heating. A critical band is a band of noise that can be masked by a pure sound having the same intensity as the band of noise, and a frequency in the middle of the band of noise. The width of the critical bands increases with increasing frequency. The audio frequency range of 0 Hz to 20 kHz is normally divided into 25 critical bands.

In FIG. 1, a digital audio input signal, for example, a PCM audio signal in the frequency range of 0 Hz to 20 kHz, for example, is supplied to the input terminal 10. The input signal is divided by the band-dividing filter 11, which is preferably a Quadrature Mirror (QMF) filter, into a frequency range signal in the frequency range of 0 Hz to 10 kHz and a high frequency range signal in the frequency range of 10 to 20 kHz. The frequency range signal in the frequency range of 0 Hz to 10 kHz is further divided by the band-dividing filter 12, which is also preferably a QMF filter, into a low frequency range signal in the frequency range of 0 Hz to 5 kHz and a middle frequency range signal in the frequency range of 5 to 10 kHz.

The 10 kHz to 20 kHz frequency range signal from the band-dividing filter 11 is fed into the orthogonal transform circuit 13, which is preferably a modified discrete cosine transform (MDCT) circuit, and the block size decision circuit 19. The 5 kHz to 10 kHz frequency range signal from the band-dividing filter 12 is fed into the MDCT circuit 14, and the block size decision circuit 20. The 0 Hz to 5 kHz frequency range signal from the band-dividing filter 12 is fed into the MDCT circuit 14, and the block size decision circuit 21.

The block size that is subject to MDCT processing is decided in each of the block size decision circuits 19, 20 and 21. The frequency range signals from the band-dividing filters 11 and 12 are MDCT processed by the MDCT circuits 13, 14 and 15 using block sizes indicated by block size data supplied from the block size decision circuits 19, 20 and 21.

Figure 2:
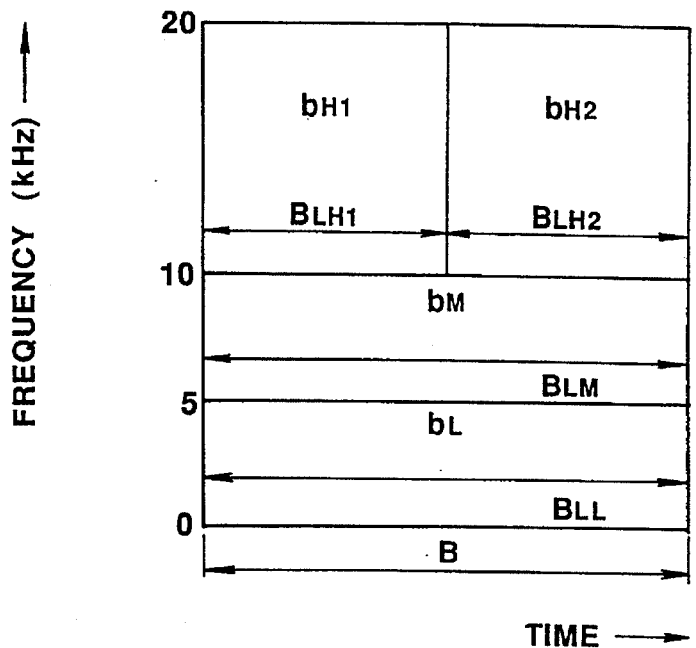
FIG. 2 shows a practical example of the block size in each MDCT circuit.

FIG. 2 shows a practical example of block sizes used by the MDCT circuits 13, 14 and 15. In this, the frequency ranges are made wider and the time resolution is increased (i.e., the block length is made shorter) in the direction of increasing frequency. In the same time as one MDCT operation carried out on the blocks $b_L$, $b_M$ of the low-frequency range signal (0 Hz to 5 kHz) and the middle frequency range signal (5 to 10 kHz), respectively, each of which blocks contains, for example, 256 samples, two MDCT operations are carried out on the blocks $b_{H1}$, $b_{H2}$ of the high frequency range signal (10 to 20 kHz), each of which blocks contains, for example, 128 samples.

The arrangement just described enables the construction of the apparatus to be simplified by having the same number of spectral coefficients in each frequency range, while providing a frequency resolution that is greater in the low- and middle-frequency ranges, where frequency resolution is critical, and a time resolution that is greater in the high-frequency range, because transient signals include more high frequency components. Additionally, the time resolution in all the frequency ranges may be adaptively increased when the input signal undergoes significant temporal changes by further dividing the block lengths by a factor of 2 or 4.

Returning to FIG. 1, the spectral components produced by the MDCT circuits 13, 14, and 15 are grouped into critical bands, and are supplied to the adaptive bit allocation and quantizing circuits 16, 17, and 18.

The adaptive bit allocation and quantizing circuits 16, 17, and 18 requantize the spectral coefficients in each critical band using the number of bits allocated for quantizing the spectral coefficients in the critical band. The re-quantized spectral coefficients are fed to the output terminals 22, 24 and 26. Block floating information, indicating the signal magnitude resulting from normalization; and word length information, indicating the number of bits used to quantize the spectral coefficients in each critical band, are fed simultaneously to the output terminals 23, 25, and 27.

The quantized spectral coefficients, the block floating information, and the word length information are provided as an output signal, or otherwise are transformed into a suitable output signal format by a multiplexer, an error correction circuit, and a modulating circuit, not shown in FIG. 1. The output signal, in a format suitable for transmission or recording, is fed to a recording or other processing apparatus to be recorded on a recording medium, such as a magnetic tape or a disc, especially an optical disc.

Because of the compression applied to the input signal by the compressor according to the invention, the output signal has a bit rate considerably less than that of the input signal. Thus, the output signal can be stored in a storage medium with less storage capacity (e.g., a smaller optical disk) than that of a medium required to store the input signal; and can be transmitted using a transmission medium with a lower transmission rate that a transmission medium required to transmit the input signal.

Figure 3:
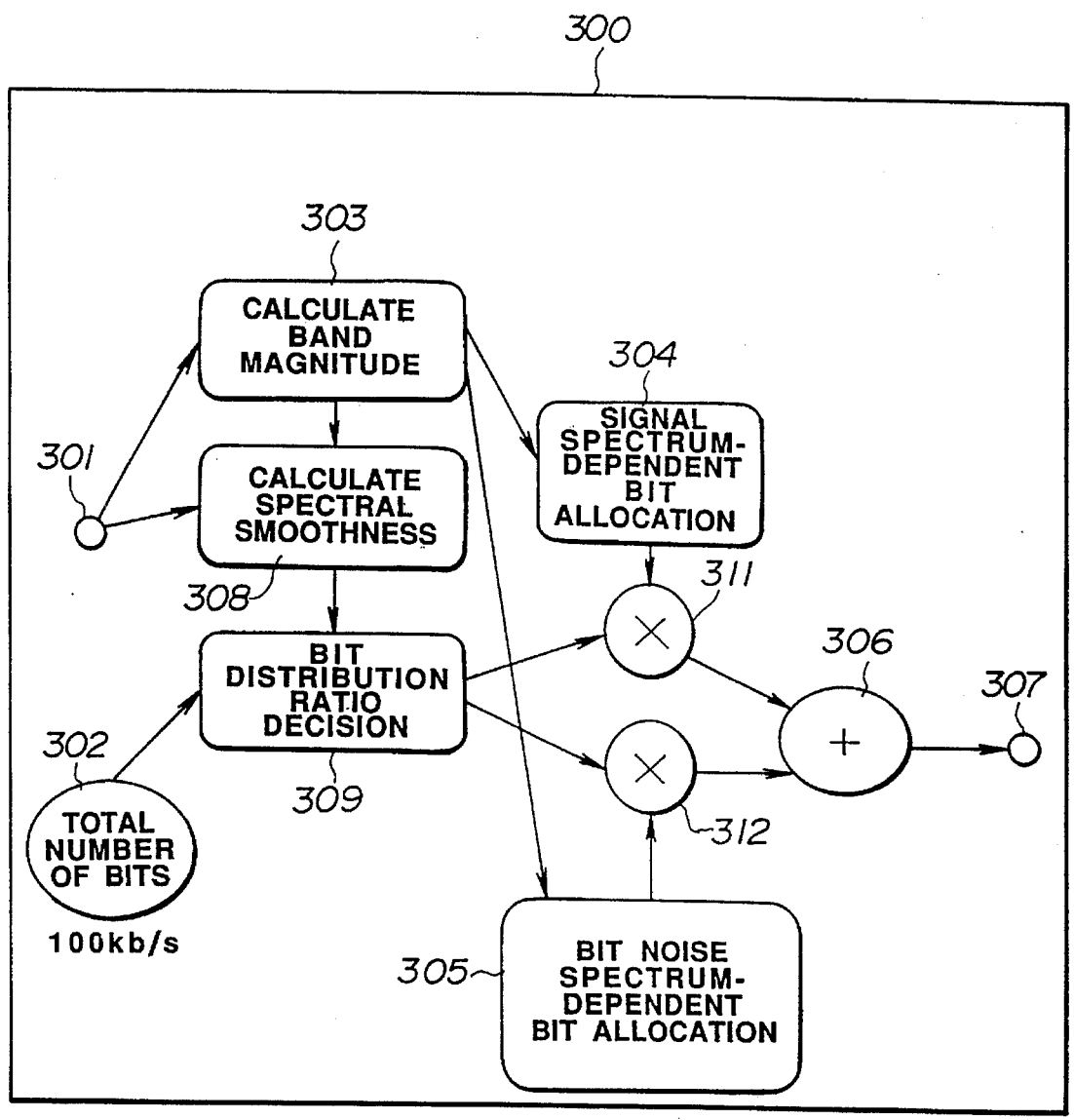
FIG. 3 is a block diagram showing a practical example of an adaptive bit allocation circuit.

FIG. 3 shows a practical example of the adaptive bit allocation and quantizing circuits 16, 17, and 18. The spectral coefficients from the MDCT circuits 13, 14, and 15 in FIG. 1 are fed into the band magnitude calculating circuit 303 via the input terminal 301 of the adaptive bit allocation and quantizing circuit 300. The band magnitude calculating circuit calculates a magnitude for each critical band by calculating the root mean square values of the amplitudes of the spectral coefficients in the critical band. The band magnitude may alternatively be derived from the peak or mean values of the amplitudes of the spectral coefficients in the critical band, or in some other way.

Figure 4:
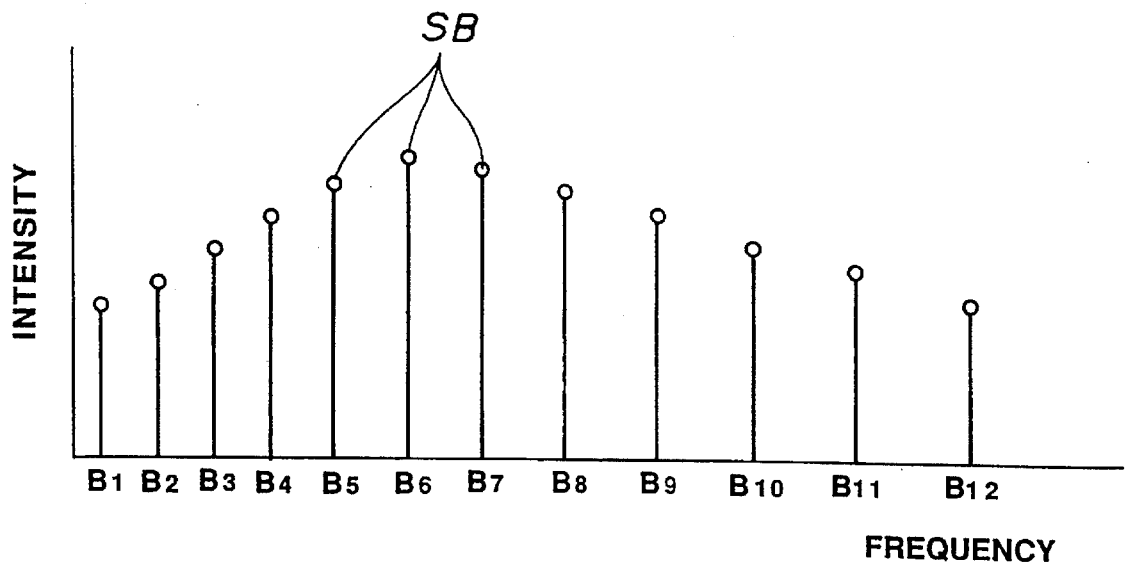
FIG. 4 is a graph showing the spectrum of the output of the energy calculating circuit in each critical band.

The band magnitude calculating circuit 303 provides as its output a band magnitude for each critical band, as shown in FIG. 4. In FIG. 4, for simplicity, only 12 bands (B1 to B12) are shown to represent the critical bands and the sub-bands into which the higher-frequency critical bands may be divided.

The operation of the adaptive bit allocation and quantizing circuits 16, 17, and 18 will now be described further with reference to FIG. 3.

The spectral coefficients from the MDCT circuits 13, 14, and 15 are supplied to the input terminal 301 and thence to the band magnitude calculating circuit 303. The band magnitude calculating circuit 303 calculates a band magnitude for each critical band and for each sub band into which higher-frequency critical bands are subdivided.

The band magnitudes calculated by the band magnitude calculating circuit 303 are supplied to the signal spectrum-dependent bit allocation circuit 304. The signal spectrum-dependent bit allocation circuit allocates a fraction of the total available number of quantizing bits in a way that results in quantizing noise with a white noise spectrum.

The total available number of quantizing bits, for example, 100 kb/s, is distributed for allocation among the critical bands between a signal spectrum-dependent bit allocation and a noise spectrum-dependent bits allocation. The distribution ratio between the two different types of bit allocation depends on the tonality of input signal, that is, the smoothness of the spectrum of the input signal. The smoothness of the spectrum of the input signal is indicated by a spectral smoothness index calculated by the spectral smoothness calculating circuit 308.

The signal spectrum-dependent bit allocation circuit 304 allocates the quantizing bits distributed for allocation according to the signal spectrum-dependent bit allocation among the critical bands in accordance with the logarithm of the magnitude of each critical band.

The noise spectrum-dependent bit allocation circuit 305, which performs bit allocation according to an allowable noise spectrum, receives the band magnitude for each critical band from the band magnitude calculating circuit 303. In response to the band magnitude spectrum, the noise spectrum-dependent bit allocation circuit determines an allowable noise spectrum, i.e., an allowable noise level for each critical band, taking account of masking. Then, noise spectrum-dependent bit allocation circuit allocates the number of bits distributed for allocation according to the noise spectrum-dependent bit allocation among the critical bands to produce the required allowable noise spectrum.

The number of signal spectrum-dependent bits determined for each critical band, and the number of noise spectrum-dependent bits determined for each critical band are summed to give a total number of quantizing bits for quantizing the spectral coefficients in the critical band. The adaptive bit allocation and quantizing circuits 16, 17, and 18 in FIG. 1 then requantize each spectral coefficient in each critical band using the total number of quantizing bits allocated for quantizing the spectral coefficients in the critical band. The spectral coefficients quantized in this manner are fed to the output terminals 22, 24 and 26.

The noise spectrum-dependent bit allocating circuit 305 includes an allowable noise spectrum calculating circuit which takes account of the masking effect of the input signal to calculate the allowable noise spectrum. Masking refers to the phenomenon by which a sound is rendered inaudible to the human sense of hearing when it is masked by another sound. Masking includes temporal masking by a sound in the time domain, and simultaneous masking by a sound in the frequency domain. As a result of masking, any noise that is subject to masking temporally or simultaneously will not be heard. Consequently, in an actual audio signal, noise within the temporal or simultaneous masking range of the signal is regarded as allowable noise.

Figure 5:
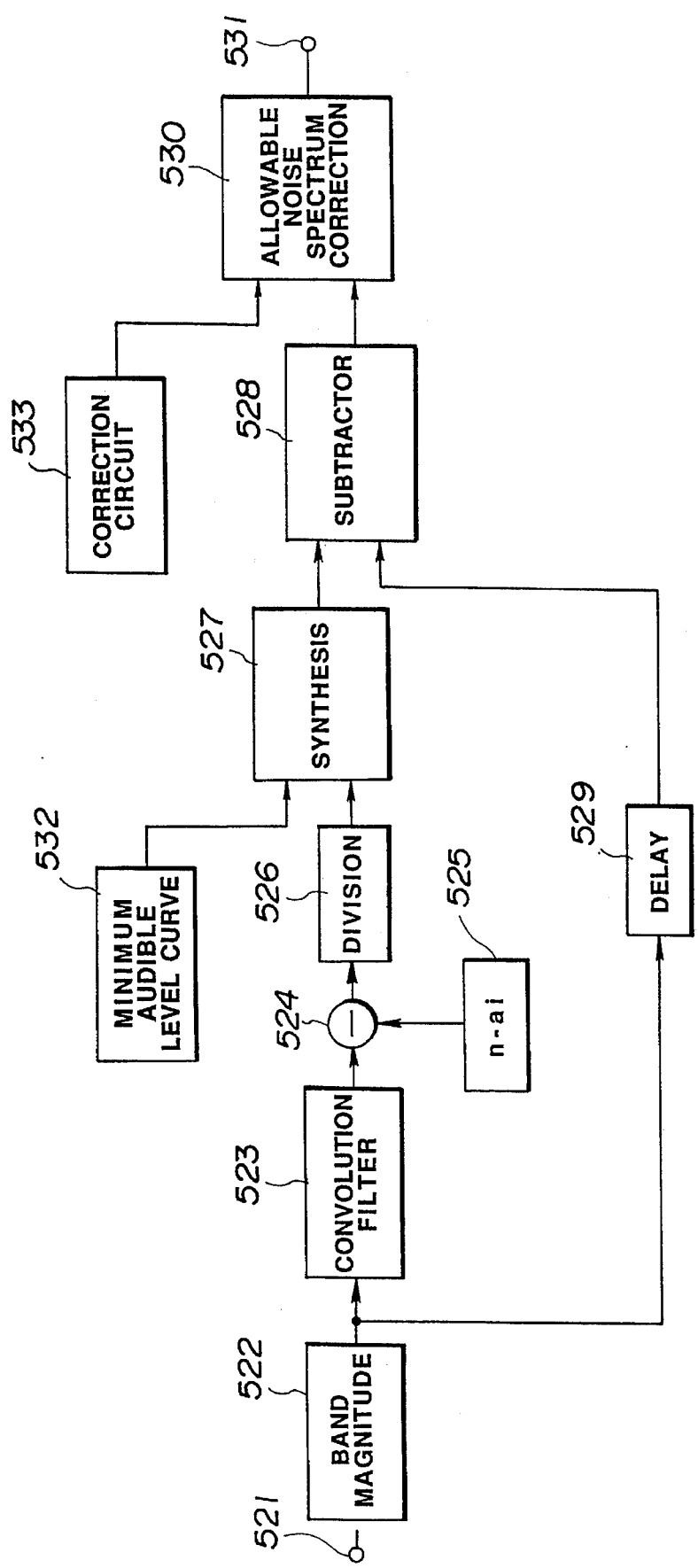
FIG. 5 is a block diagram showing an allowable noise calculating circuit for calculating the subjectively allowable noise spectrum.
Figure 6:
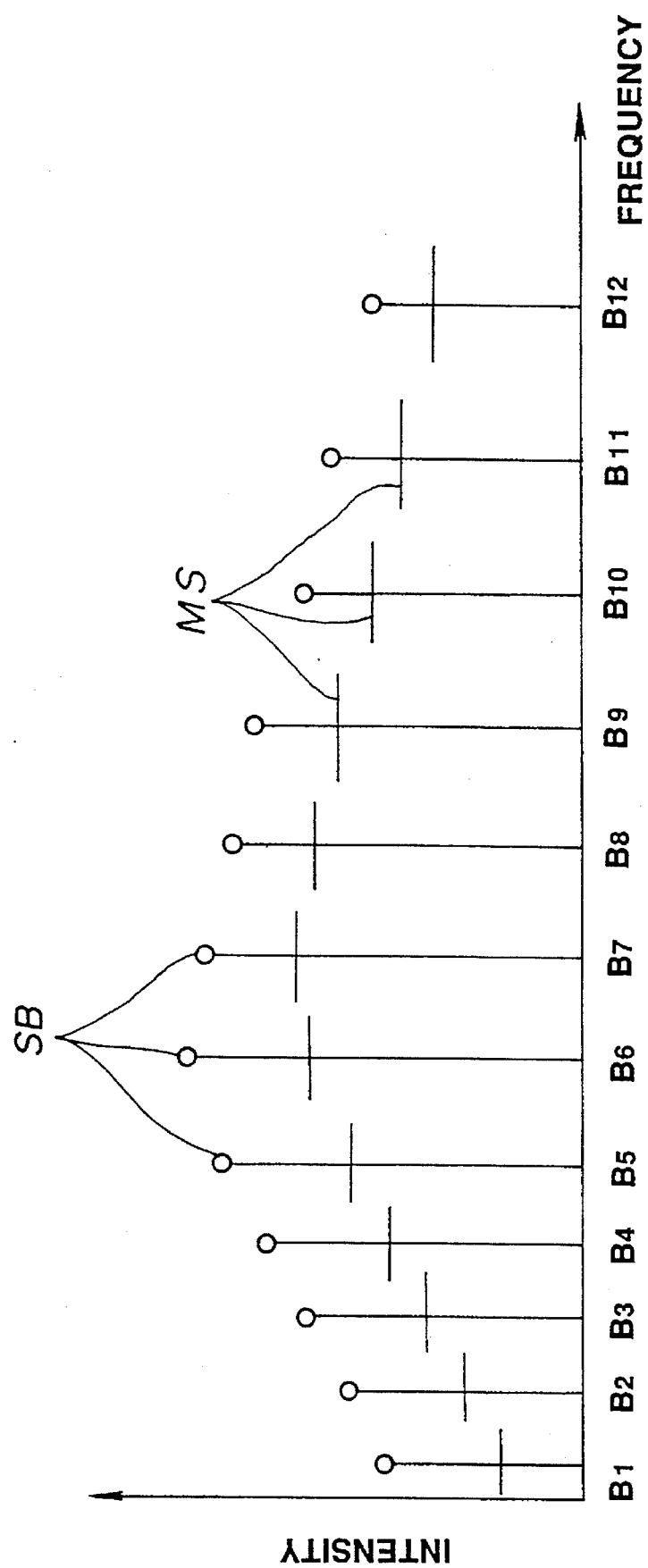
FIG. 6 is a bark spectrum with the frequency axis divided into critical bands.

A block diagram of a practical example of the allowable noise spectrum calculating circuit is shown in FIG. 5. In FIG. 5, the spectral coefficients from the MDCT circuits 13, 14, and 15 are fed into the input terminal 521, whence they pass into the band magnitude calculating circuit 522 where the magnitude of each critical band is determined by calculating the sum of the amplitudes of the spectral coefficients in the critical band. Alternatively, the peak, RMS, or mean values of the amplitudes of the spectral coefficients may be used. The spectrum of the magnitudes of the critical bands produced by the magnitude calculating circuit 522 is generally called a bark spectrum. FIG. 6 shows a typical bark spectrum SB, but only 12 critical bands B1 to B12 are shown to simplify the drawing.

To determine the masking effect of a bark spectrum, the bark spectrum SB is convoluted, that is, the values of the bark spectrum are multiplied by a predetermined weighting function, and the resulting products are summed together. To this end, the values of the bark spectrum from the band magnitude calculating circuit 522 are fed into the convolution filter 523.

The convolution filter 523 consists of plural delay elements that sequentially delay input data, plural multipliers, such as 25 multipliers, one for each critical band, for multiplying the output of each delay element by a weighting function, and a summing circuit for summing the multiplier outputs. The convolution processing just described derives the masking spectrum MS shown in FIG. 6 from the bark spectrum, also shown in FIG. 6.

Practical examples of the weighting functions in the convolution filter circuit 523 are 0.15, 0.0019, 0.0000086, 0.4, 0.06 and 0.007 in the multipliers M−1, M−2, M−3, M+1, M+2 and M+3, respectively. The weighting factor for the multiplier M is unity, and M is an arbitrary integer of from 1 to 25.

An output of the convolution filter 523 is fed into the subtractor 524 to find the level $\alpha$ corresponding to the allowable noise level in the convoluted region. The level $\alpha$ corresponding to the allowable noise level in the convoluted region is the level that, after deconvolution, will give the allowable noise level for each critical band.

An allowed function, which represents the masking level, is supplied to the subtractor 524 for finding the level $\alpha$. The level $\alpha$ is controlled by increasing or decreasing the allowed function. The allowed function is supplied by the (n−ai) function generator 525, which will be described below.

When the number of a critical band is i, the number of the lowest-frequency critical band being 1, the level $\alpha$ corresponding to the allowed noise level is determined by the following equation:

$$\alpha = S - (n - ai) \quad (1)$$

where n and a are respectively constants (a>0), and S is intensity of the convolution-processed bark spectrum. In equation (1), (n−ai) represents the allowed function. In the preferred embodiment, n is set to 38 and a is set to 1. With these settings, there is no deterioration of the sound quality, and a satisfactory compressed signal is therefore obtained.

The level $\alpha$, determined as just described, is fed into the divider 526, which applies deconvolution to the level $\alpha$ in the convoluted region. This way, the masking spectrum becomes the allowable noise spectrum. Although the deconvolution normally requires a complicated arithmetic operation, the simple divider 526 is employed in the present embodiment to provide deconvolution.

Figure 7:
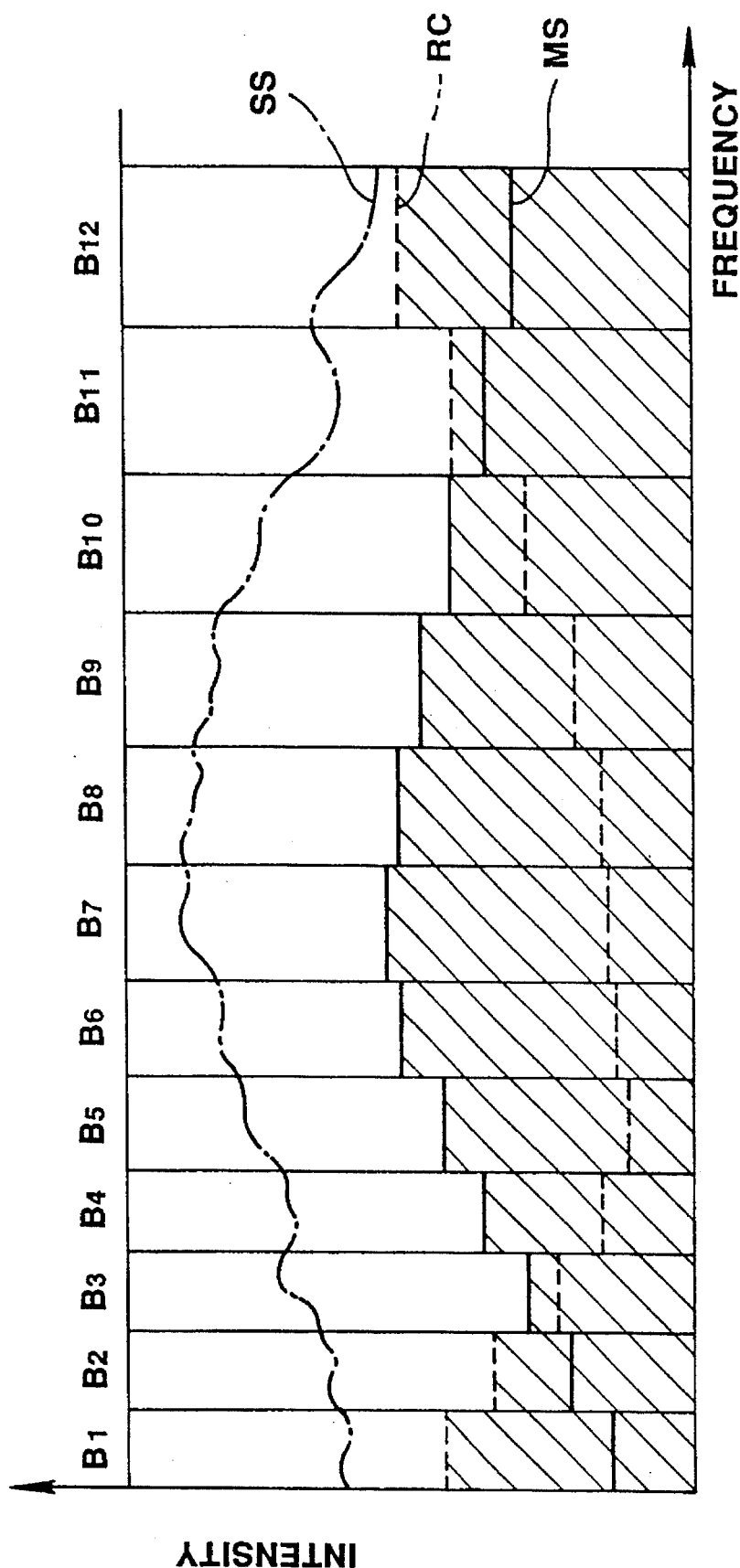
FIG. 7 is a graph showing a combination of the minimum audible level curve and the masking spectrum.

The masking spectrum, i.e., the masking level for each critical band is fed via the synthesis circuit 527 to the subtractor 528, which also receives the output of the band magnitude calculating circuit 522, that is, the above-mentioned bark spectrum SB, via the delay circuit 529. The subtractor 528 subtracts the masking spectrum from the bark spectrum SB so that the portion of the bark spectrum SB below the masking level MS is masked, as shown in FIG. 7. The delay circuit 529 delays the bark spectrum SB from the band magnitude calculating circuit 522 to take account of processing delay in the circuits between the band magnitude calculating circuit and the subtractor 528.

The output of the subtractor 528 is fed to the output terminal 531 via the allowable noise spectrum correction circuit 530. From the output terminal, the signal is fed to a ROM, not shown, which stores plural allocated bit number information. The ROM selects a set of allocated bit number information, i.e., an allocated bit number for each critical band, in response to the output of the subtractor 528, corrected by the allowable noise spectrum correction circuit 530. The set of allocated bit number information is fed into the adaptive bit allocation and quantizing circuits 16, 17, and 18, where the spectral coefficients from the MDCT circuits 13 to 15 are quantized using the number of bits indicated by the allocated bit number for each critical band.

The spectral coefficients in each critical band are quantized in the adaptive bit allocation and quantizing circuits 16, 17, and 18 using a number of quantizing bits allocated to the critical band depending on the level of the difference between the magnitude of the critical band and the respective output of the allowed noise spectrum calculating circuit.

The synthesis circuit 527 synthesizes data indicating the so-called minimum audible level curve RC with the masking spectrum MS, as shown in FIG. 7. The minimum audible level curve represents another of the characteristics of the human sense of hearing, and is supplied from the minimum audible level curve generator 532. Noise with an absolute level below the minimum audible level curve cannot be heard. For a given quantization, the shape of the minimum audible curve depends on the playback volume. However, since the manner in which music fits within the dynamic range of practical 16-bit digital systems does not vary significantly, if quantizing noise is inaudible in the frequency band to which the ear is most sensitive, i.e., the frequency band in the vicinity of 4 kHz, it can be assumed that quantizing noise below the level of the minimum audible level curve will not heard in other frequency bands. Accordingly, when the quantizing noise level in the vicinity of 4 kHz corresponding to the word length set by the system is not heard, the allowed noise level can be provided by synthesizing the minimum audible level curve RC and the masking spectrum MS. The resulting allowed noise level in each critical band may be up to the level indicated by the cross-hatched portion in FIG. 9. In this embodiment, the level of the minimum audible level curve at 4 kHz is set to correspond to the minimum level corresponding to quantizing using, e.g., 20 bits. FIG. 7 also shows the signal spectrum SS.

The allowable noise spectrum correction circuit 530 corrects the allowable noise level at the output of the subtractor 528 on the basis of, e.g., an equal-loudness curve, generated by the correction circuit 533. The equal-loudness curve is yet another characteristic of the human sense of hearing. This curve is derived by determining the sound pressure levels at various frequencies that can be heard at the same intensity as that of a pure sound at 1 kHz. The equal-loudness curve is substantially similar to the minimum audible curve RC shown in FIG. 7. In the equal-loudness curve, a sound in the vicinity of 4 kHz is heard with the same intensity as that of a sound at 1 kHz, even if the sound pressure level is 8 to 10 dB less than that of the 1 kHz sound. On the other hand, a sound in the vicinity of 50 Hz must have a sound pressure level of about 15 dB greater than the sound pressure level of a 1 kHz sound to be heard at the same intensity. For this reason, the allowed noise level above the level of the minimum audible level curve should have a frequency characteristic given by a curve corresponding to the equal-loudness curve. It can be seen that adapting to the characteristic of the human sense of heating requires correcting the allowed noise level by taking the equal-loudness curve into consideration.

The allowable noise spectrum is produced by using a certain portion of the total available number of bits, e.g., 100 kb/s. This portion is decreased with increasing tonality of the input signal.

The distribution ratio of the total available number of bits between the two bit allocation techniques, i.e., noise spectrum-dependent bit allocation and signal spectrum-dependent bit allocation, is set by the spectral smoothness index indicating the smoothness of the spectrum of the input signal. The practical method of distributing bits between the two bit allocation techniques will now be described with reference to FIG. 3.

In FIG. 3, the spectral coefficients from the MDCT circuits 13, 14, and 15 (FIG. 1) are fed via the input terminal 301 to the spectral smoothness calculating circuit 308, which is also supplied with the output from the band magnitude calculating circuit 303. The spectral smoothness calculating circuit 308 calculates an index indicating the smoothness of the spectrum of the input signal. In the present embodiment, the sum of absolute values of the differences between adjacent values of the signal spectrum, divided by the sum of the values of the signal spectrum, is used as the index. For example, the spectral smoothness calculating circuit can calculate the quotient of the sum of absolute values of the differences between the values of adjacent band magnitudes and the sum of all the band magnitudes as the spectral smoothness index, i.e., $$I = 0.5 \times \frac{\sum_{i=1}^{n} |S_i - S_{i-1}|}{\sum_{i=1}^{n} |S_i|}$$

where I is the spectral smoothness index, and $S_i$ is the band magnitude in the i'th critical band.

The spectral smoothness index is fed from the spectral smoothness calculating circuit 308 to the bit distribution ratio decision circuit 309 which sets the distribution ratio between the bits allocated according to the signal spectrum-dependent bit allocation and the bits allocated according to the noise spectrum-dependent bit allocation. The bit distribution ratio is set so that, as the spectral smoothness index from the spectral smoothness calculating circuit 308 increases, indicating that the smoothness of the spectrum of the input signal is reduced, more bits are allocated by the noise spectrum-dependent bit allocation, and fewer bits are allocated by the signal spectrum-dependent bit allocation.

The bit distribution ratio decision circuit 309 transmits a control signal indicating the bit distribution ratio to the multiplier 311, and control signal representing the complement of the bit distribution ratio (1 minus the distribution ratio) to the multiplier 312. The multiplier 311 adjusts the signal spectrum-dependent bit allocation and the multiplier 312 adjusts the noise spectrum-dependent bit allocation for the distribution ratio.

When the spectrum of the input signal is smooth, the control signal representing the bit distribution ratio from the bit distribution ratio decision circuit 309 assumes a value of 0.8 to allocate more bits by the signal spectrum-dependent bit allocation. The control signal representing the complement of the bit distribution ratio fed to the multiplier 312 is set to 1−0.8=0.2. The multiplier 311 multiplies the bit allocation information from the signal spectrum-dependent bit allocation circuit 304 by 0.8, while the multiplier 312 multiplies the bit allocation information from the noise spectrum-dependent bit allocation circuit 305 by 0.2. The outputs of the multipliers 311 and 312 are summed by the adder 306 to provide the total bit allocation information for each critical band. The total bit allocation number is fed to the output terminal 307.

Figure 8:
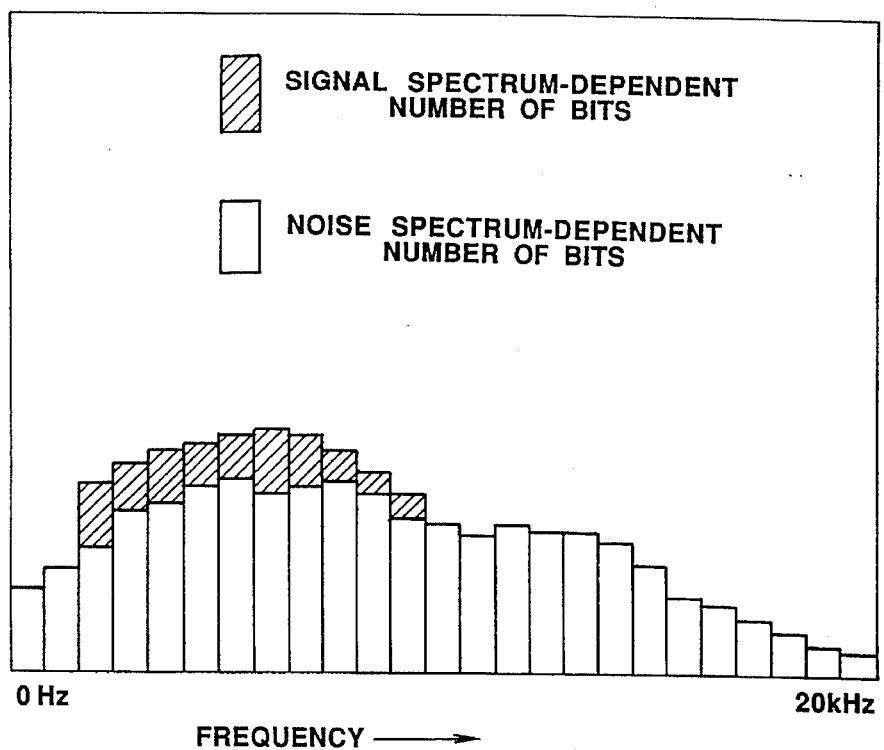
FIG. 8 is a graph showing an example of the adaptive bit allocation by the compressor according to the present invention with an input signal having a substantially flat spectrum.
Figure 9:
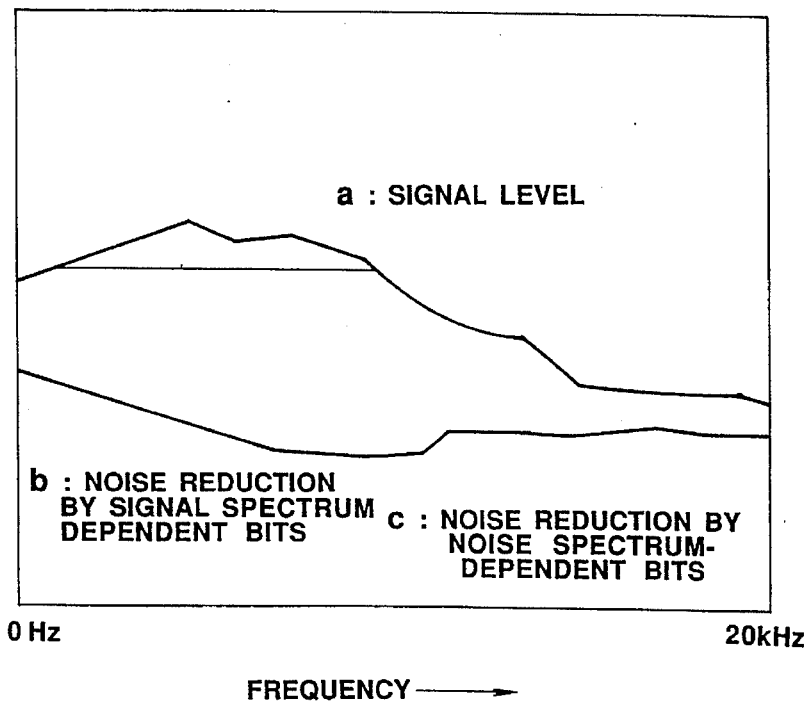
FIG. 9 is a graph showing an example of the quantizing noise spectrum produced by the compressor according to the invention with an input signal having a substantially flat spectrum.
Figure 10:
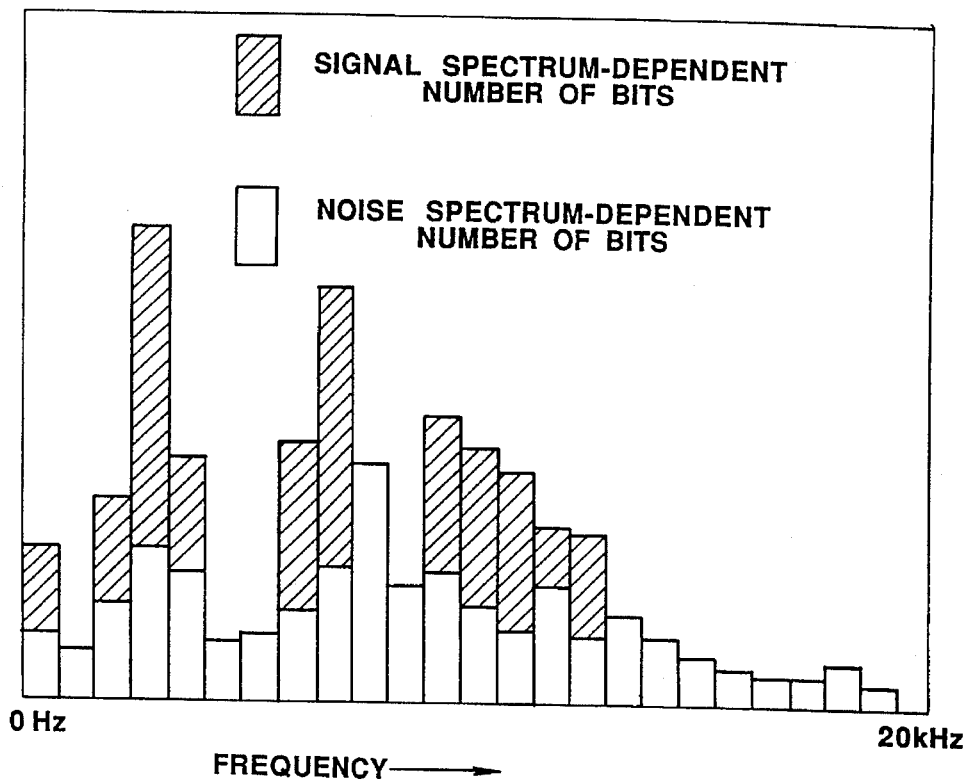
FIG. 10 is a graph showing an example of the adaptive bit allocation by the compressor according to the present invention with a highly tonal input signal.
Figure 11:
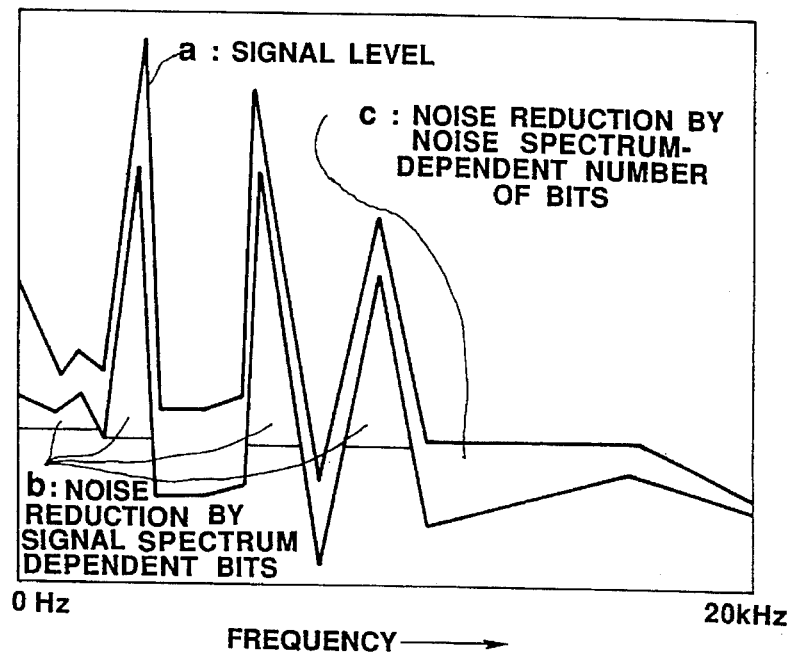
FIG. 11 is a graph showing an example of the quantizing noise spectrum produced by the compressor according to the invention with a highly tonal input signal.

A practical example of the operation of the bit allocation scheme described above will now be described with reference to FIGS. 8 through 11. FIGS. 8 and 10 show the bit allocation and FIGS. 9 and 11 show the resulting quantizing noise. FIGS. 8 and 9 respectively show the bit allocation and the resulting quantizing noise when the input signal has a flat spectrum. FIGS. 10 and 11 respectively show the bit allocation and the resulting quantizing noise when the input signal has a highly tonal spectrum.

In FIGS. 8 and 10, the unshaded portions denote the number of bits allocated for quantizing the spectral coefficients in each critical band according to the signal spectrum dependent bit allocation, and the shaded portions denote the corresponding number of bits allocated according to the noise spectrum-dependent bit allocation. In FIGS. 9 and 11, the curve a denotes the input signal spectrum, and the areas b and c denote areas in which noise is reduced by the signal spectrum-dependent bit allocation and by the noise spectrum-dependent bit allocation, respectively.

FIGS. 8 and 9 show an input signal with a fairly flat spectrum. The noise spectrum-dependent bit allocation assures a high signal-to-noise ratio over the entire audio frequency range. However, fewer bits are allocated towards the lower and higher frequency extremes of the audio frequency range because these areas are of lesser significance, subjectively. The signal spectrum-dependent bit allocation, although allocating relatively few bits, allocates bits mainly in the low- to mid-frequency range when the input signal is relatively high to produce a quantizing noise spectrum that is white.

Conversely, when the input signal has a highly tonal spectrum, as shown in FIG. 11, the number of bits allocated by the signal spectrum-dependent bit allocation is increased, and the resulting reduction in quantizing noise is used for reducing quantizing noise in an extremely narrow frequency range. The bits allocated by the noise spectrum-dependent allocation are more broadly distributed across the audio frequency range. Using the two different types of bit allocation improves the quantizing of an input signal consisting of one or more narrow spectral lines, as shown in FIG. 11.

Figure 12:
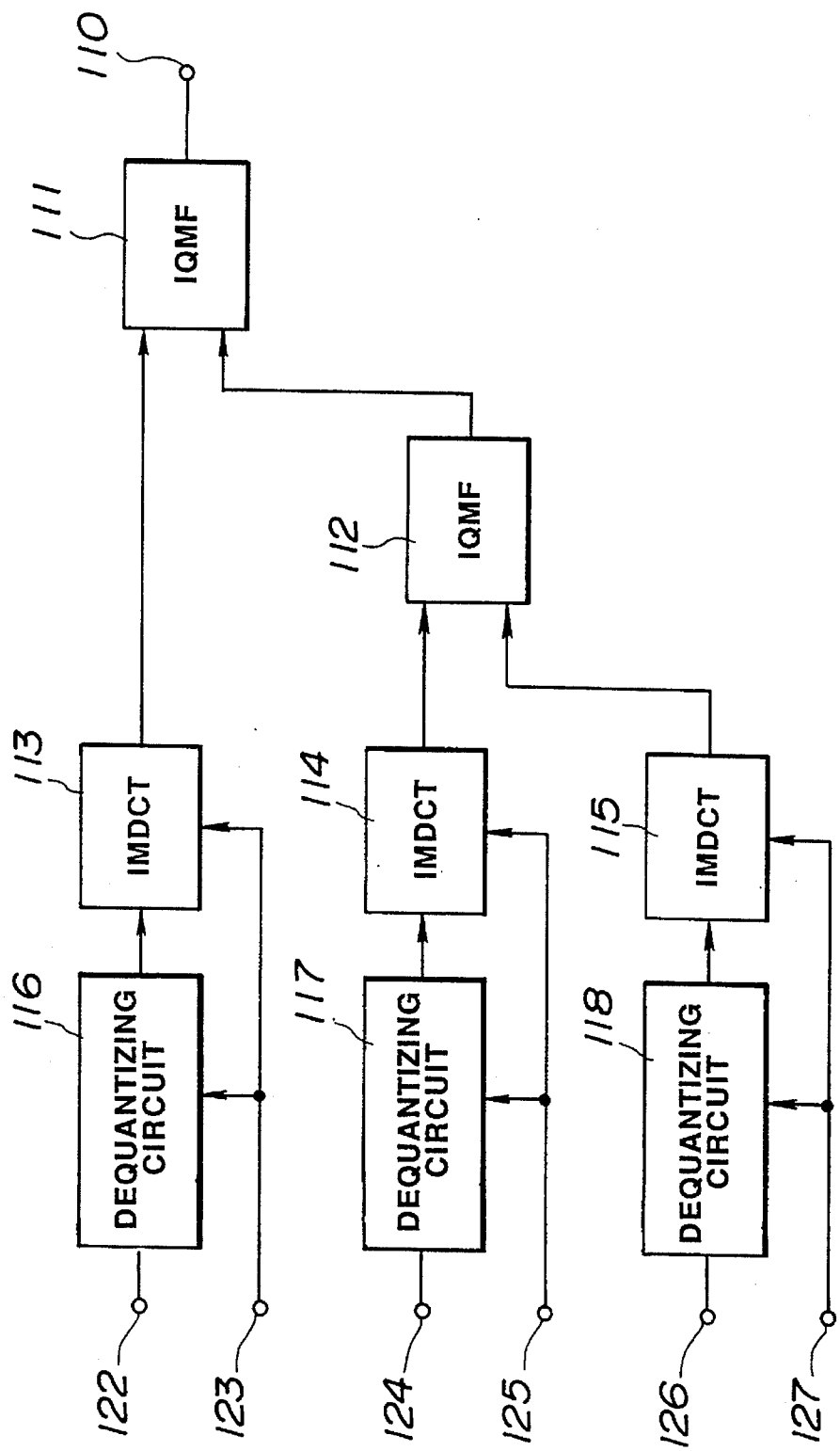
FIG. 12 is a block diagram showing the expander according to the present invention.

FIG. 12 shows an embodiment of a complementary expander according to the present invention for expanding signals compressed by the compressor described above, after transmission or recording and reproduction. The quantized spectral coefficients, block floating information, and word length information are extracted from the reproduced signal by a de-multiplexer (not shown). The quantized spectral coefficients in each critical band are supplied to the input terminals 122, 124, 126 of the expander and the word length information is supplied to the input terminals 123, 125, 127. The dequantizing circuits 116, 117 and 118 reverse the adaptive bit allocation using the word length information. The resulting spectral coefficients are orthogonally transformed into three frequency range signals in the time domain by the inverse MDCT (IMDCT) circuits 113, 114 and 115. The three frequency range signals are combined by the inverse QMF (IQMF) circuits 112 and 111, and the resulting full frequency range signal is fed to the output terminal 110.

The quantization scheme described above provides a bit allocation that has aurally desirable results and that provides optimum quantizing of signals consisting of a lone spectral line, such as a 1 kHz sine wave input. These results are produced by simple arithmetic operations without the need for repeated adjustments of the bit allocation. When the input signal spectrum is dispersed, as in the case of music signals, the subjective noise level is reduced is reduced by masking effects. With a single sine wave input, the signal-to-noise ratio is increased because bits may be concentrated in the area of the largest signal amplitude.

I claim:

1. An apparatus for compressing a digital audio input signal to provide a compressed output signal, the apparatus comprising:

means for deriving plural spectral coefficients from the input signal and for grouping the spectral coefficients into bands;

distributing means, responsive to the input signal, for distributing a total available number of quantizing bits between signal spectrum-dependent quantizing bits and noise spectrum-dependent quantizing bits;

means for determining a magnitude for each band, and in response thereto, for allocating the signal spectrum-dependent quantizing bits among the bands to allocate to each band a number of signal spectrum-dependent quantizing bits for quantizing each spectral coefficient in the band;

means for determining a subjectively-allowable noise spectrum based at least upon the determined magnitude of each band, and in response thereto, for allocating the noise spectrum-dependent quantizing bits among the bands to allocate to each band a number of noise spectrum-dependent quantizing bits for quantizing each spectral coefficient in the band; and quantizing means for quantizing the spectral coefficients in each band using a total number of quantizing bits determined by summing the number of signal spectrum-dependent quantizing bits allocated to the band and the number of noise spectrum-dependent quantizing bits allocated to the band.

2. The apparatus of claim 1, wherein the means for deriving plural spectral coefficients from the input signal input comprises:

means for dividing the input signal in frequency without dividing the input signal in time to provide plural frequency range signals; and means for dividing each frequency range signal in time into blocks, and for further dividing the frequency range signal in each block in frequency to provide the spectral coefficients.

3. The apparatus of claim 1, wherein the means for deriving spectral coefficients from the input signal input comprises:

means for dividing the input signal in frequency without dividing the input signal in time to provide plural frequency range signals; and an orthogonal transform circuit connected to each frequency range signal and providing plural spectral coefficients therefrom.

4. An apparatus for compressing a digital audio input signal to provide a compressed output signal, the apparatus comprising:

means for deriving plural spectral coefficients from the input signal and for grouping the spectral coefficients into bands;

distributing means, responsive to a smoothness of the input signal, for distributing a total available number of quantizing bits between signal spectrum-dependent quantizing bits and noise spectrum-dependent quantizing bits;

means for determining a magnitude for each band, and in response thereto, for allocating the signal spectrum-dependent quantizing bits among the bands to allocate to each band a number of signal spectrum-dependent quantizing bits for quantizing each spectral coefficient in the band;

means for determining a subjectively-allowable noise spectrum based upon at least the determined magnitude of each band, and in response thereto, for allocating the noise spectrum-dependent quantizing bits among the bands to allocate to each band a number of noise spectrum-dependent quantizing bits for quantizing each spectral coefficient in the band; and quantizing means for quantizing the spectral coefficients in each band using a total number of quantizing bits determined by summing the number of signal spectrum-dependent quantizing bits allocated to the band and the number of noise spectrum-dependent quantizing bits allocated to the band.

5. The apparatus of claim 4, wherein the distributing means comprises:

means for distributing more of the total available number of quantizing bits to the noise spectrum-dependent quantizing bits as the smoothness of the spectrum of the input signal increases.

6. The apparatus of claim 5, wherein the spectrum of the input signal includes plural spectral points, each having a value and the apparatus further comprises:

means for calculating a difference between the values of adjacent spectral points to indicate the smoothness of the spectrum of the input signal.

7. The apparatus of claim 5, further comprising:

means for determining a magnitude for each band; and means for calculating a difference between the magnitudes of the bands to indicate the smoothness of the spectrum of the input signal.

8. The apparatus of claim 5, further comprising:

means for applying block floating to each band, and for calculating a block floating coefficient for each band; and means for calculating a difference between the block floating coefficients of adjacent bands to indicate the smoothness of the spectrum of the input signal.

9. An apparatus for expanding a compressed digital signal to provide a digital audio output signal, the compressed digital signal being derived from a digital audio input signal having a spectrum by a compression method including the steps of:

deriving plural spectral coefficients from the input signal, grouping the spectral coefficients into bands, and determining a magnitude for each band;

distributing, in response to the input signal, a total available number of quantizing bits between noise spectrum-dependent bits for allocation among the bands depending on a subjectively allowable noise spectrum based upon at least the magnitude determined for each band, and signal spectrum-dependent bits for allocation among the bands according to the magnitudes of the bands;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the quantized spectral components; and means for deriving the output signal from the dequantized spectral components.

10. The apparatus for expanding a compressed digital signal of claim 9, wherein the compression method further comprises the step of including in the compressed signal the quantized spectral coefficients, block floating information, and word length information indicating the number of bits used to quantize the spectral coefficients in each band;

the extracting means further comprises means for extracting word length information from the compressed signal; and the dequantizing means further comprises means for dequantizing the quantized spectral components using the extracted word length information.

11. An apparatus for expanding a compressed digital signal to provide a digital audio output signal, the compressed digital signal being derived from a digital audio input signal having a spectrum having a smoothness, by a compression method including the steps of:

deriving plural spectral coefficients from the input signal, grouping the spectral coefficients into bands, and determining a magnitude for each band;

distributing, in response to the input signal, a total available number of quantizing bits between noise spectrum-dependent bits for allocation among the bands depending on a subjectively allowable noise spectrum, and signal spectrum-dependent bits for allocation among the bands according to the magnitudes of the bands, wherein the input signal has a smoothness and more of the total available number of quantizing bits are distributed as noise spectrum-dependent quantizing bits as the smoothness of the spectrum of the input signal increases;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the .quantized spectral components; and means for deriving the output signal from the dequantized spectral components.

12. An apparatus for expanding a compressed digital signal to provide a digital audio output signal, the compressed digital signal being derived from a digital audio input signal having a spectrum which includes plural spectral points, each point having a value, by a compression method including the steps of:

deriving plural spectral coefficients from the input signal, grouping the spectral coefficients into bands, and determining a magnitude for each band;

calculating a difference between the values of adjacent spectral points to indicate the smoothness of the spectrum of the input signal;

distributing, in response to the input signal, a total available number of quantizing bits between noise spectrum-dependent bits for allocation among the bands depending on a subjectively allowable noise spectrum, and signal spectrum-dependent bits for allocation among the bands according to the magnitudes of the bands, wherein the input signal has a smoothness and more of the total available number of quantizing bits are distributed as noise spectrum-dependent quantizing bits as the smoothness of the spectrum of the input signal increases;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the quantized spectral components; and means for deriving the output signal from the dequantized spectral components.

13. An apparatus for expanding a compressed digital signal to provide a digital audio output signal, the compressed digital signal being derived from a digital audio input signal having a spectrum by a compression method including the steps of:

deriving plural spectral coefficients from the input signal, grouping the spectral coefficients into bands, and determining a magnitude for each band;

calculating a difference between the magnitudes of the bands to indicate the smoothness of the spectrum of the input signal;

distributing, in response to the input signal, a total available number of quantizing bits between noise spectrum-dependent bits for allocation among the bands depending on a subjectively allowable noise spectrum, and signal spectrum-dependent bits for allocation among the bands according to the magnitudes of the bands, wherein the input signal has a smoothness and more of the total available number of quantizing bits are distributed as noise spectrum-dependent quantizing bits as the smoothness of the spectrum of the input signal increases;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the quantized spectral components; and means for deriving the output signal from the dequantized spectral components.

14. An apparatus for expanding a compressed digital signal to provide a digital audio output signal, the compressed digital signal being derived from a digital audio input signal having a spectrum by a compression method including the steps of:

deriving plural spectral coefficients from the input signal, grouping the spectral coefficients into bands, and determining a magnitude for each band;

applying block floating to each band, and calculating a block floating coefficient for each band;

calculating a difference between the block floating coefficients of adjacent bands to indicate the smoothness of the spectrum of the input signal;

distributing, in response to the input signal, a total available number of quantizing bits between noise spectrum-dependent bits for allocation among the bands depending on a subjectively allowable noise spectrum, and signal spectrum-dependent bits for allocation among the bands according to the magnitudes of the bands, wherein the input signal has a smoothness and more of the total available number of quantizing bits are distributed as noise spectrum-dependent quantizing bits as the smoothness of the spectrum of the input signal increases;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, Wherein the allocation of bits among the bands depends on the subjectively allowable noise spectrum based upon at least the magnitude determined for each band;

dequantizing means for dequantizing the quantized spectral components; and means for deriving the output signal from the dequantized spectral components.

15. An apparatus for expanding a compressed digital signal to provide a digital audio output signal, the compressed digital signal being derived from a digital audio input signal having a spectrum by a compression method including the steps of:

deriving plural spectral coefficients from the input signal by dividing the input signal in frequency without dividing the input signal in time to provide plural frequency range signals, and dividing each frequency range signal in time into blocks, and further dividing the frequency range signal in each block in frequency to provide the spectral coefficients, grouping the spectral coefficients into bands, and determining a magnitude for each band;

distributing, in response to the input signal, a total available number of quantizing bits between noise spectrum-dependent bits for allocation among the bands depending on a subjectively allowable noise spectrum based upon at least the magnitude determined for each band, and signal spectrum-dependent bits for allocation among the bands according to the magnitudes of the bands;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the quantized spectral components; and means for deriving the output signal from the dequantized spectral components, wherein the means for deriving includes an orthogonal transform circuit.

16. An apparatus for expanding a compressed digital signal to provide a digital audio output signal, the compressed digital signal being derived from a digital audio input signal having a spectrum by a compression method including the steps of:

deriving plural spectral coefficients from the input signal by dividing the input signal in frequency without dividing the input signal in time to provide plural frequency range signals, orthogonally transforming each frequency range signal to provide plural spectral coefficients therefrom, grouping the spectral coefficients into bands, and determining a magnitude for each band;

distributing, in response to the input signal, a total available number of quantizing bits between noise spectrum-dependent bits for allocation among the bands depending on a subjectively allowable noise spectrum based upon at least the magnitude determined for each band, and signal spectrum-dependent bits for allocation among the bands according to the magnitudes of the bands;

quantizing the spectral coefficients in each band using a total number of bits determined by summing the noise spectrum-dependent bits allocated to the band and the signal spectrum-dependent bits allocated to the band; and including the quantized spectral components in the compressed signal;

the expander comprising:

extracting means for extracting quantized spectral coefficients from the compressed signal, wherein the allocation of bits among the bands depends on the subjectively allowable noise spectrum based upon at least the magnitude determined for each band;

dequantizing means for dequantizing the quantized spectral components; and means for deriving the output signal from the dequantized spectral components, wherein the means for deriving includes an orthogonal transform circuit.

17. A system for recording on a recording medium a digital audio input signal having a bit rate, and for reproducing the digital input signal from the recording medium to provide a digital audio output signal, the system deriving from the input signal a compressed signal for recording on the recording medium, and deriving the output signal from the compressed signal reproduced from the recording medium, the compressed signal having a bit rate lower than the bit rate of the input signal, the system comprising:

a compressor comprising:

means for deriving plural spectral coefficients from the input signal and for grouping the spectral coefficients into bands;

distributing means, responsive to the input signal, for distributing a total available number of quantizing bits between signal spectrum-dependent quantizing bits and noise spectrum-dependent quantizing bits;

means for determining a magnitude for each band, and in response thereto, for allocating the signal spectrum-dependent quantizing bits among the bands to allocate to each band a number of signal spectrum-dependent quantizing bits for quantizing each spectral coefficient in the band;

means for determining a subjectively-allowable noise spectrum based upon at least the determined magnitude of each band; and in response thereto, for allocating the noise spectrum-dependent quantizing bits among the bands to allocate to each band a number of noise spectrum-dependent quantizing bits for quantizing each spectral coefficient in the band;

quantizing means for quantizing the spectral coefficients in each band using a total number of quantizing bits determined by summing the number of signal spectrum-dependent quantizing bits allocated to the band and the number of noise spectrum-dependent quantizing bits allocated to the band, and including means for including the quantized spectral coefficients in the compressed signal; and an expander, comprising:

extracting means for extracting quantized spectral coefficients from the compressed signal;

dequantizing means for dequantizing the quantized spectral components; and means for deriving the output signal from the dequantized spectral components.

18. The system of claim 17, wherein in the compressor, the including means further comprises means for including block floating information, and word length information indicating the number of bits used to quantize the spectral coefficients in each band in the compressed digital signal; and in the expander:

the extracting means further comprises means for extracting word length information from the compressed signal; and the dequantizing means further comprises means for dequantizing the quantized spectral components using the extracted word length information.

19. The system of claim 17, wherein the input signal has a spectrum having a smoothness; and in the compressor, the distributing means further comprises:

means for distributing more of the total available number of quantizing bits to the noise spectrum-dependent quantizing bits as the smoothness of the spectrum of the input signal increases.

20. The system of claim 19, wherein the spectrum of the input signal includes plural spectral points, each having a value, and the compressor further comprises:

means for calculating a difference between the values of adjacent spectral points to indicate the smoothness of the spectrum of the input signal.

21. The system of claim 19, wherein the compressor further comprises:

means for determining a magnitude for each band; and means for calculating a difference between the magnitudes of the bands to indicate the smoothness of the spectrum of the input signal.

22. The system of claim 19, wherein the compressor further comprises:

means for applying block floating to each band, and for calculating a block floating coefficient for each band; and means for calculating a difference between the block floating coefficients of adjacent bands to indicate the smoothness of the spectrum of the input signal.

23. The system of claim 17, wherein, in the compressor, the means for deriving spectral coefficients from the input signal comprises:

means for dividing the input signal in frequency without dividing the input signal in time to provide plural frequency range signals; and means for dividing each frequency range signal in time into blocks, and for further dividing the frequency range signal in each block in frequency to provide the spectral coefficients.

24. The system of claim 17, wherein in the compressor, the means for deriving spectral coefficients from the input signal comprises means for dividing the input signal in frequency without dividing the input signal in time to provide plural frequency range signals; and the compressor and the expander each include an orthogonal transform circuit.

25. A method of compressing a digital audio input signal to provide a compressed output signal, comprising the steps of:

deriving plural spectral coefficients from the input signal, grouping the spectral coefficients into bands, and determining a magnitude for each band;

distributing, in response to the input signal, a total available number of quantizing bits between noise spectrum-dependent bits for allocation among the bands depending on a subjectively allowable noise spectrum, the subjectively-allowable noise spectrum based upon the determined magnitudes of the bands, and signal spectrum-dependent bits for allocation among the bands according to the determined magnitudes of the bands;

quantizing the spectral coefficients in each band using a total number of bits determined by summing the noise spectrum-dependent bits allocated to the band and the signal spectrum-dependent bits allocated to the band; and including the quantized spectral components in the compressed signal.

26. The method of claim 25, further comprising the step of: including in the compressed signal block floating information and word length information indicating the number of bits used to quantize the spectral coefficients in each band.

27. The method of claim 25, wherein the input signal has a spectrum having a smoothness; and the distributing step further comprises the step of:

distributing more of the total available number of quantizing bits to the noise spectrum-dependent quantizing bits as the smoothness of the spectrum of the digital input signal increases.

28. The method of claim 27, wherein the spectrum of the input signal includes plural spectral points, each having a value; and the method further comprises the step of calculating a difference between the values of adjacent spectral points to indicate the smoothness of the spectrum of the input signal.

29. The method of claim 27, further comprising the steps of: .

determining a magnitude for each band; and calculating a difference between the magnitudes of the bands to indicate the smoothness of the spectrum of the input signal.

30. The method of claim 27, further comprising the steps of:

applying block floating to each band, and calculating a block floating coefficient for each band; and calculating a difference between the block floating coefficients of adjacent bands to indicate the smoothness of the spectrum of the input signal.

31. The method of claim 25, wherein the step of deriving spectral coefficients from the input signal further comprises the steps of:

dividing the input signal in frequency without dividing the input signal in time to provide plural frequency range signals; and dividing each frequency range signal in time into blocks, and further dividing the frequency range signal in each block in frequency to provide the spectral coefficients.

32. The method of claim 25, wherein the step of deriving spectral coefficients from the input signal comprises the steps of:

dividing the input signal in frequency without dividing the input signal in time to provide plural frequency range signals; and orthogonally transforming each frequency range signal to provide plural spectral coefficients therefrom.

* * * * *